United States Patent
Tham et al.

[11] Patent Number: 6,049,702
[45] Date of Patent: Apr. 11, 2000

[54] INTEGRATED PASSIVE TRANSCEIVER SECTION

[75] Inventors: J. L. Julian Tham, Irvine; Deepak Mehrotra, Thousand Oaks, both of Calif.; James L. Bartlett, Cedar Rapids, Iowa; Mau Chung F. Chang, Thousand Oaks, Calif.; Henry O. Marcy, 5th, Camarillo, Calif.; Kenneth D. Pedrotti; David R. Pehlke, both of Thousand Oaks, Calif.; Charles W. Seabury, Calabasas, Calif.; Jun J. Yao, Thousands Oaks, Calif.

[73] Assignee: Rockwell Science Center, LLC, Thousand Oaks, Calif.

[21] Appl. No.: 08/985,383

[22] Filed: Dec. 4, 1997

[51] Int. Cl.⁷ .................................................. H04B 1/44
[52] U.S. Cl. .............................. 455/78; 455/81; 455/83
[58] Field of Search .................. 455/73, 78, 80, 455/81, 83, 87, 90, 575, 351; 330/278; 331/179; 257/700, 701, 758

[56] References Cited

U.S. PATENT DOCUMENTS

| | | | |
|---|---|---|---|
| 3,662,294 | 5/1972 | Jacobs et al. | 333/33 |
| 4,931,799 | 6/1990 | Wen et al. | 455/87 |
| 5,015,973 | 5/1991 | Kawakami et al. | 455/83 |
| 5,486,797 | 1/1996 | Suzuki | 455/83 |
| 5,511,238 | 4/1996 | Bayraktaroglu | 455/81 |
| 5,515,047 | 5/1996 | Yamakido et al. | 341/153 |
| 5,578,976 | 11/1996 | Yao | 333/262 |
| 5,604,470 | 2/1997 | Atokawa | 455/83 |
| 5,640,049 | 6/1997 | Rostoker et al. | 257/758 |
| 5,673,054 | 9/1997 | Hama | 343/44 |
| 5,679,971 | 10/1997 | Tamba et al. | 257/357 |
| 5,691,676 | 11/1997 | Snel et al. | 333/204 |
| 5,731,607 | 3/1998 | Kohama | 257/275 |
| 5,774,792 | 6/1998 | Tanaka et al. | 455/78 |
| 5,834,975 | 11/1998 | Bartlett et al. | 330/278 |
| 5,872,489 | 2/1999 | Chang et al. | 331/179 |
| 5,878,331 | 3/1999 | Yamamoto et al. | 455/81 |

OTHER PUBLICATIONS

Abidi et al, "The Future of CMOS Wireless Transceivers", *IEEE/1997 ISSCC Slide Supplement*, Session 7, Paper FA 7.2, pp. 82–83 and 372–373.

Michael Pecht, "Fundamental Package Architectures", *Integrated Circuit, Hybrid, and Multichip Module Package Design Guidelines*, John Wiley & Sons, Inc., 1994, pp. 2–5.

Yao et al., "A Surface Micromachined Miniature Switch for Telecommunications Applications With Signal Frequencies from DC up to 4 GHZ", In Tech. Digest, Transducer–95, Stockholm, Sweden, Jun. 25–29, 1995, pp. 384–387.

Cheng T. Wang, *Introduction to Semiconductor Technology: GaAs and Related Compounds*, John Wiley & Sons, 1990, pp. 123–133, 187–195, 422–433.

Alan B. Grebene, *Bipolar and MOS Analog Integrated Circuit Design*, John Wiley & Sons, 1984, pp. 54–120.

*Primary Examiner*—Reinhard J. Eisenzopf
*Assistant Examiner*—Duc Nguyen
*Attorney, Agent, or Firm*—Koppel & Jacobs

[57] ABSTRACT

The passive components of a transceiver, such as transmit/receive switches, antennas, inductors, capacitors and resonators, are integrated together on a common substrate to form an integrated passive transceiver section, which, in combination with other components, provides a highly reliable, low-cost, high-performance transceiver. Microelectromechanical (MEM) device fabrication techniques are used to provide low-loss, high-performance switches and low-loss, high-Q reactive components, and enable the passive transceiver section's high level of integration. The passive components are preferably integrated on a low-cost glass substrate, with transceiver circuits containing active components fabricated on a separate substrate; the separate substrates are interconnected to implement the RF/analog and analog/digital interface portions of a transceiver. Additional MEM switching devices permit multiple, parallel signal paths to be switched in and out of the transceiver circuitry as needed to optimize performance.

27 Claims, 11 Drawing Sheets

INTEGRATED PASSIVE TRANSCEIVER SECTION

BACKGROUND OF THE INVENTION

1. Field of the Invention

This invention relates to the field of wireless transceivers, particularly to the integration of a transceiver's passive components.

2. Description of the Related Art

The demand for low-cost, reliable wireless communications continues to increase at a rapid rate, as do the demands on the technologies enabling such communications. Research is being conducted on many fronts to find ways to make the circuitry found inside devices such as cellular phones smaller, cheaper, easier to fabricate, less power-hungry, and more reliable.

Figure 1:
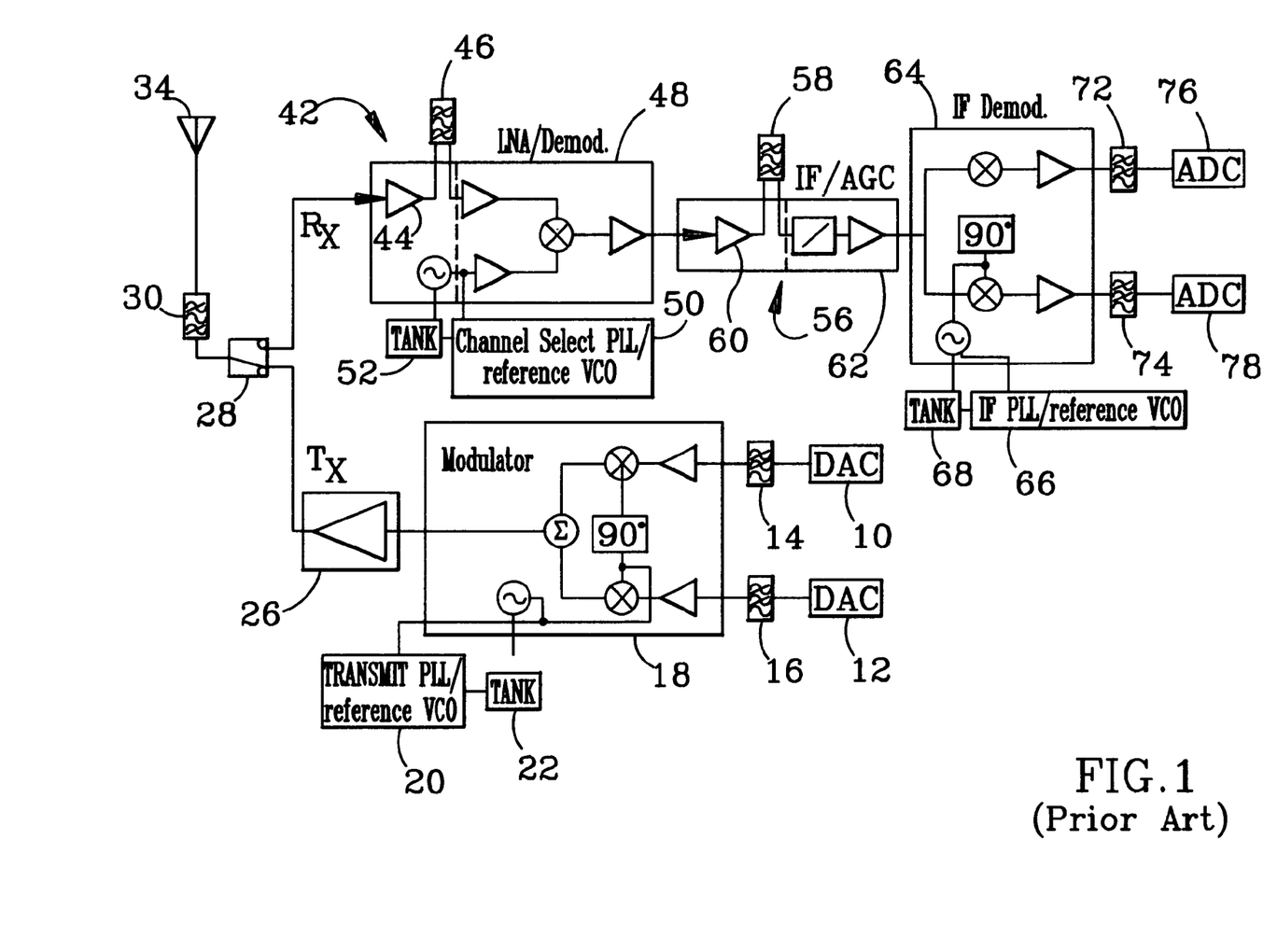
FIG. 1 is a block diagram of a prior art transceiver's RF/analog and A/D interface circuitry.

A block diagram of the RF/analog and analog/digital (A/D) interface circuitry of a basic transceiver is shown in FIG. 1; the circuitry shown is combined with other components (not shown) to form a complete transceiver. The transmitter ($T_x$) portion of the transceiver includes digital-to-analog converters (DACs) 10 and 12, low-pass filters 14 and 16 for filtering the outputs of DACs 10 and 12, respectively, and a modulator 18 that performs a frequency conversion on signals received at its inputs and which is driven by a phase-locked loop (PLL) circuit 20 that includes a reference voltage-controlled-oscillator (VCO) and a resonator (tank circuit) 22. The modulator's output is fed to a power amplifier 26, and the amplified output is fed to one side of a transmit/receive (T/R) switch 28, filtered with a bandpass filter 30, and connected to an antenna 34.

The receiver portion ($R_x$) is connected to the other side of T/R switch 28. Incoming signals are received by antenna 34 and filtered by bandpass filter 30 before being fed to a low-noise amplifier (LNA)/demodulator circuit 42. The output of the circuit's LNA 44 is passed through a bandpass filter 46 before being fed to a demodulator 48 which performs a frequency conversion on the signal received by antenna 34. The demodulator 48 is driven by a PLL circuit 50 which includes a reference VCO and a tank circuit 52. The demodulator output drives an intermediate-frequency automatic gain control (IF AGC) stage 56, with a bandpass filter 58 interposed between the stage's IF amplifier 60 and its AGC circuitry 62. The AGC output is fed to an IF demodulator 64 which is driven by a PLL circuit 66 that includes a reference VCO and a tank circuit 68. The IF demodulator's two outputs are passed through respective low-pass filters 72 and 74 before being fed to respective analog-to-digital converters (ADCs) 76 and 78. DACs 10, 12 and ADCs 76, 78 serve as A/D interface circuitry, with the DAC inputs and ADC outputs connected to other digital transceiver circuitry (not shown).

Current transceivers are implemented using a variety of device technologies. For example, DACs 10 and 12, ADCs 76 and 78, and all other digital baseband transceiver circuitry are typically CMOS circuits. Modulator 18, LNA/demodulator 42, IF/AGC stage 56, and IF demodulator 64 generally use bipolar junction transistors (BJTs). The power amplifier 26 is often fabricated on a gallium arsenide (GaAs) substrate, particularly for a high-power application such as a cellular phone. Bandpass and lowpass filters 14, 16, 30, 46, 58, 72 and 74, as well as tank circuits 22, 52 and 68, and antenna 34, are generally built with discrete components. T/R switch 28 is also typically made from discrete components, or are made from costly, complex PIN diode circuits if integrated. However, the poor efficiency of PIN diode circuits at high frequencies (>900 MHZ) typically limits their use, particularly in battery-powered applications. One design, described in a paper by A. Abidi, et al., "The Future of CMOS Wireless Transceivers", ISSCC97, Paper FA 7.2 (1997), implements all of the above-named components using CMOS components, with the exception of the T/R switches, inductors, capacitors and resonators, the implementation of which still requires discrete components.

Because a variety of technologies must be combined, current transceivers typically use a hybrid packaging scheme. Hybrid packaging generally requires the use of performance-degrading wire bonds between components or individual integrated circuit (I.C.) dies, and a labor-intensive and costly assembly process. Such an assembly is typically larger than is desired, particularly when the limited space and weight requirements imposed on designers of battery-powered handheld devices must be met.

SUMMARY OF THE INVENTION

An integrated passive transceiver section is presented which solves many of the problems discussed above. Through the development and use of micro-electromechanical (MEM) fabrication techniques and devices discussed herein, an integration of a transceiver's passive components is achieved in which its T/R switches, antennas, inductors, capacitors, and resonators are all integrated on a common substrate. The "passive transceiver section" so formed is combined with other circuitry on the same or other substrates to provide a highly reliable, low-cost, high-performance transceiver in a package which is smaller, lighter and more easily fabricated than prior art designs.

The novel passive transceiver section uses T/R switches which are integrated using MEM fabrication techniques to provide very low-loss, high-performance switching while eliminating the present need for discrete components or lower efficiency PIN diode circuits. The passive section's other passive components, including inductors, capacitors, resonators and antennas, are integrated on the same substrate as the T/R switches using common processing steps. Because MEM device fabrication processes provide greater metal layer thicknesses than do standard thin-film processes, the passive components so integrated possess low-loss and high-Q characteristics which enable the transceiver to furnish a high level of performance despite the elimination of discrete components. The inductors and capacitors are combined as necessary to form filters and/or tank circuits.

The passive transceiver components are preferably integrated together on a low-cost insulating (i.e., glass) substrate to form a first I.C. die. Transceiver circuits containing active devices, such as the modulator, LNA/demodulator, IF AGC stage, IF demodulator, PLL circuits, DACs, ADCs, and power amplifier, are fabricated separately on one or more separate dies, which are then interconnected with the first die to form the RF/analog and A/D interface portions of the transceiver. Combining these transceiver portions with additional circuitry, on the same or separate dies, or as discrete components, forms a complete transceiver. The interconnections between dies are made via wire bonds, or a flip-chip approach can be employed.

Another version of the invention integrates all of a transceiver's RF/analog and A/D interface circuitry, including its passive components, on a silicon substrate. While a transceiver built with this approach is feasible, the RF/analog and A/D circuitry would occupy a large amount of surface area on the silicon wafer, making it expensive.

Furthermore, a silicon substrate introduces performance-degrading parasitic capacitances not present with an insulating substrate.

Further refinements include the use of tunable inductors and capacitors to facilitate the adjustment of passive component values as needed, eliminating the need to acquire highly accurate discrete components prior to the assembly of a prior art hybrid device. Also disclosed is the extended use of MEM switching devices to allow multiple passive and active circuits, such as LNAs, filters and power amplifiers, to be dynamically switched in and out as needed to achieve different signal path characteristics.

Further features and advantages of the invention will be apparent to those skilled in the art from the following detailed description, taken together with the accompanying drawings.

DETAILED DESCRIPTION OF THE INVENTION

Figure 2:
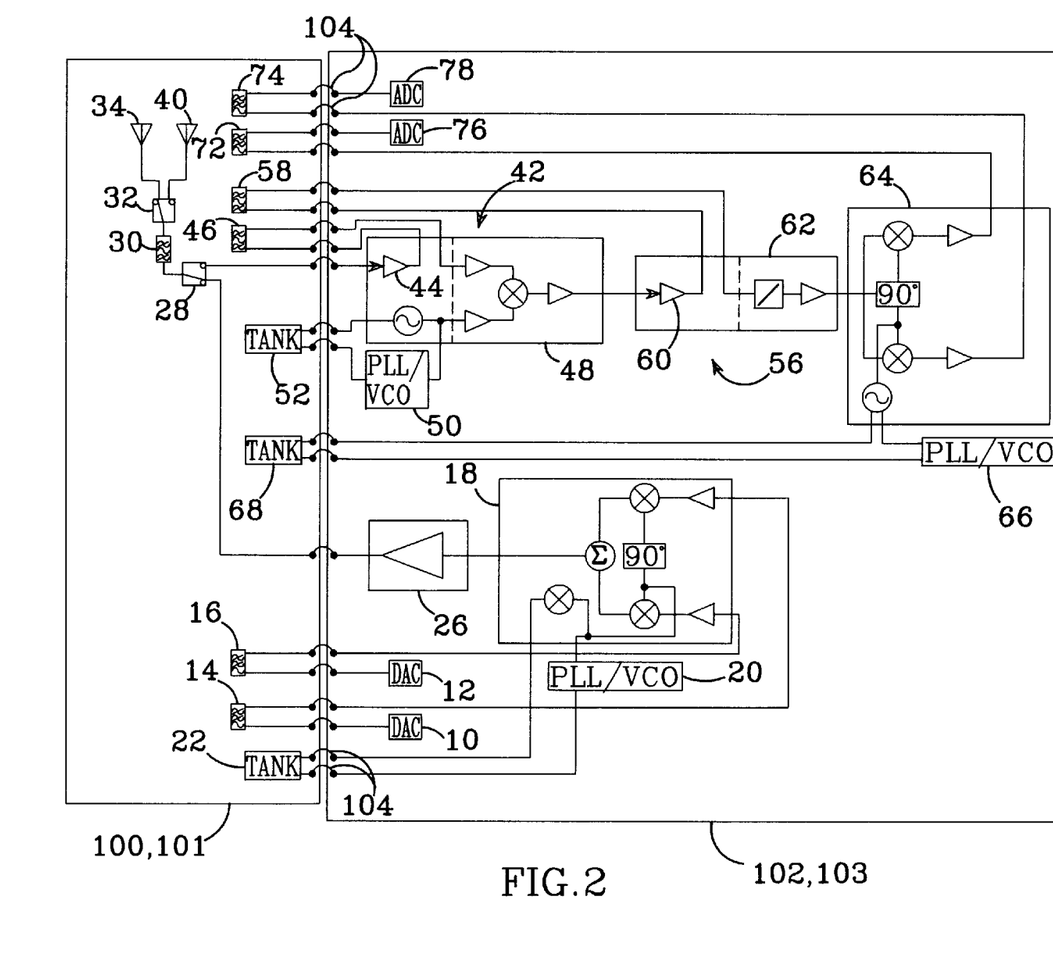
FIG. 2 is a block diagram of an integrated passive transceiver section per the present invention, interconnected with circuitry an a second substrate.

The RF/analog and A/D portions of a transceiver having the same basic architecture as that of FIG. 1, but which are fabricated with an unprecedented degree of integration, is shown in FIG. 2. A substrate 100, preferably glass, contains all of the following "passive" transceiver components, i.e., components which do not provide gain: antennas 34 and 40, T/R switches 28 and 32, filters 14, 16, 30, 46, 58, 72 and 74, and tank circuits 22, 52, and 68. The filters and tank circuits/resonators are made from either combinations of integrated inductors and capacitors or with integrated resonator components which use piezo-electric materials. Tank circuits/resonators are combined with active devices to form oscillator circuits suitable for supplying a desired output frequency to the transceiver's modulators and demodulators. The passive components are integrated together on substrate 100 using common processing steps (discussed below) to form an I.C. die 101; because the die 101 includes a transceiver's passive components, it is referred to herein as a "passive transceiver section". A complete transceiver is formed by combining the passive transceiver section 101 with other necessary transceiver components. Because the passive components are an integrated whole, rather than an interconnected collection of individual subcircuits or discrete components, a transceiver can be achieved which is smaller, lighter, and more reliable than was heretofore possible.

The architecture shown in FIG. 2 is intended as merely illustrative. Transceivers can be arranged in a wide variety of configurations, with numerous component and subcircuit options available. The invention is not limited to any one transceiver design or composition. What is central to the invention is its innovative integration of passive transceiver components onto a common substrate, while simultaneously providing performance and reliability equal or superior to prior art designs. The invention will provide benefits over prior art discrete designs whenever the integration of a transceiver's passive components on a common substrate is advantageous. This will often be the case, because such integration typically lowers a device's cost, improves its reliability, and simplifies its fabrication.

When the substrate 100 is glass, the RF/analog and A/D components of the transceiver which are not part of the passive transceiver section 101, i.e., ADCs 76 and 78, DACs 10 and 12, LNA/demodulator 42, IF demodulator 64, modulator 18, PLLs 20, 50 and 66, power amplifier 26, and IF AGC stage 64, are preferably not integrated with the components on substrate 100; these active components are typically and preferably implemented on a semiconductor substrate. The active components may be implemented conventionally, as discussed in connection with FIG. 1—i.e., using CMOS, BJT and GaAs technologies where appropriate and interconnecting the individual subcircuits to the integrated circuitry on substrate 100. However, a preferred approach to accommodating these active components, particularly for lower-power applications such as a household cordless phone, is shown in FIG. 2. All of the active components named above are integrated on a silicon substrate 102, preferably using CMOS technology. Because power amplifier 26 must be implemented using CMOS transistors, rather than the GaAs devices shown in FIG. 1, this approach is best-suited to low-power applications. The integration of the active circuitry on substrate 102 forms a second I.C. die 103. The use of only two I.C. dies reduces the number of assemblies which must be connected and packaged together, so that a transceiver is provided which is smaller, lighter and more reliable than the prior art's use of three I.C. dies plus discrete components. Advantages are also realized in terms of fabrication time and cost, because only two technologies are involved: MEM for die 101 and CMOS for die 103, rather than the three technologies plus discrete components needed for prior art transceivers. The circuitry on silicon substrate 102 may also be made from bipolar devices, but CMOS is preferred for its lower power and heat dissipation requirements.

Figure 2A:
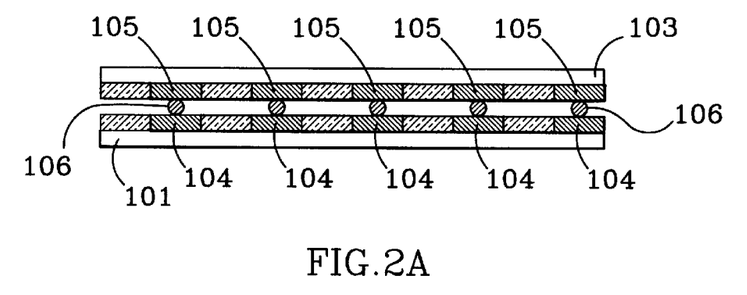
FIG. 2A is a cross-sectional view of a flip-chip die interconnection scheme which can be used with the present invention.

The circuitry resident on dies 101 and 103 may be interconnected in a variety of ways. As shown in FIG. 2, conventional wire bonds 104 can be used to interconnect the two dies. Alternatively, a "flip-chip" approach can be used, as shown in FIG. 2A. Die 101 is fabricated with conductive areas or traces 104 on its surface which connect to the die's components. Die 103 has corresponding conductive areas 105 on its surface, which also serve as circuit terminals. The respective conductive areas are interconnected by inverting die 103, aligning the corresponding conductive areas, and bringing the respective conductive areas into electrical and physical contact with each other via solder bumps 106. Flip-chip interconnection of I.C. dies, as well as other suitable die interconnection methods such as TAB bonding and routable substrates, are discussed, for example, in M. Pecht, *Integrated Circuit, Hybrid, and Multichip Module Package Design Guidelines: A Focus on Reliability*, John Wiley & Sons (1994), pp. 2–4.

Figure 3:
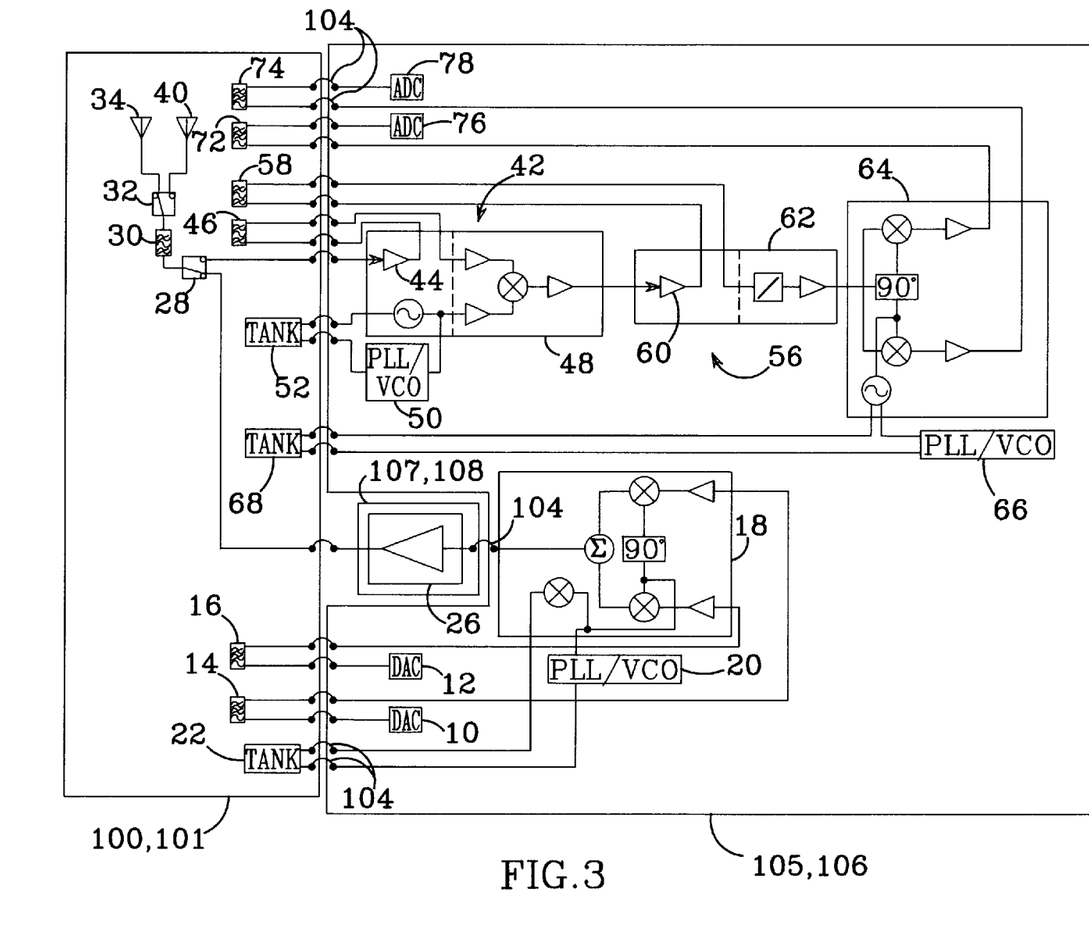
FIG. 3 is a block diagram of an integrated passive transceiver section per the present invention, illustrating the implementation of a power amplifier on a separate substrate.

A preferred transceiver packaging approach for a high-power application, such as a cellular phone, is shown in FIG. 3. All active components with the exception of power amplifier 26 are fabricated as CMOS or bipolar components on a silicon substrate 105, to form an I.C. die 106. Power amplifier 26 is then fabricated on a third substrate 107, with GaAs the preferred material for high-power, high frequency applications. The power amplifier circuitry fabricated on substrate 107 forms a die 108, which may be interconnected to die 101 and die 106 using wire bonds 104 or the other interconnection techniques discussed above.

A complete transceiver is formed when the passive transceiver section 101 and the active dies 103, 106, or 107 (depending on configuration) are combined with necessary additional transceiver circuitry 110, to process the outputs of ADCs 76 and 78 and to provide inputs to DACs 10 and 12, for example. The additional circuitry 110 may reside on the same substrate as are shown in FIGS. 2 and 3, or may be implemented with one or more separate dies or discrete components. The additional necessary circuitry 110 can include, for example, the digital signal processing (DSP) implementation of the baseband transceiver section modulation/de-modulation circuits to further process the down-converted IF signals from ADCs 76 and 78 and the baseband signals to be up-converted and transmitted as inputs to DACs 10 and 12, as well as the digital coding/decoding (CODEC) of voice input, interface circuits for data rate and power level controls, and all the modulation, encryption and communication system algorithms, memory control and other interface circuitry for handset/communication controls.

Figure 4:
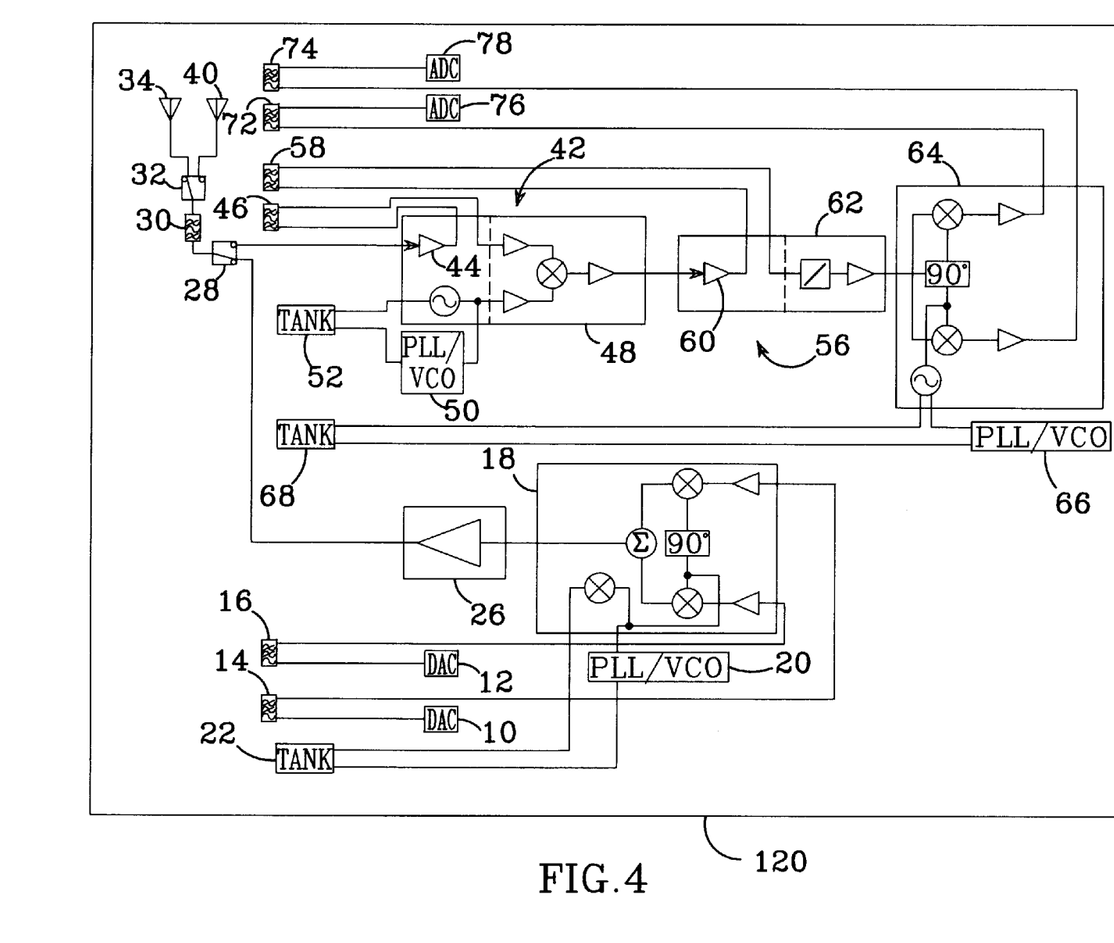
FIG. 4 is a block diagram of the RF/analog and A/D interface portions of a transceiver, integrated on a common substrate per the present invention.

A transceiver packaging approach in which all of the RF/analog and A/D transceiver circuitry discussed above is fabricated on a single common substrate is shown in FIG. 4. A substrate 120, preferably silicon, supports all of the active circuitry as discussed in connection with FIG. 2, above. The additional circuitry 110 may also reside on substrate 120, or may reside off-chip. In addition, the antennas 34 and 40, switches 28 and 32, filters 14, 16, 46, 58, 72 and 74, and tank circuits 22, 52 and 68, are fabricated on the same silicon substrate 120. Though these passive components are preferably fabricated on glass, the MEM technology which enables their integration is realizable on semiconductor substrates as well. Because this approach produces a transceiver on a single die, die interconnection schemes such as wire bonding are eliminated, improving reliability, and fabrication is simplified as only one die is produced rather than two or more.

The single substrate approach of FIG. 4 has some drawbacks, however. The inductors and capacitors which make up the filters and tank circuits tend to be large, and the amount of silicon substrate surface area consumed by combining all the components may be prohibitively large. Silicon substrate material is considerably more expensive than glass, so that the cost of a single substrate transceiver would be much higher than would the multiple die approaches described above. Also, use of a semiconductor substrate under the filters and tank circuits introduces parasitic capacitances which tend to degrade transceiver performance. Thus, though feasible, the disadvantages of a single substrate approach may outweigh its advantages.

The use of MEM devices and fabrication techniques discussed herein makes possible the integration of T/R switches, inductors, capacitors, resonators and antennas on a common substrate. The T/R switches are preferably made from MEM switches, each of which has a top electrode positioned on a cantilever arm which extends over a bottom electrode positioned on die substrate 100 (or substrate 120 for the single-substrate approach). When an actuation voltage is applied across the top and bottom electrodes, the cantilever arm is electrostatically drawn toward the substrate and a contact electrode affixed to the substrate side of the cantilever arm bridges a gapped signal line on the substrate surface, creating a continuous signal path. An SPST switch function is performed by controllably bridging and opening the gap between signal lines. MEM switches as described herein are discussed in Yao and Chang, "A Surface Micromachined Miniature Switch for Telecommunications Applications with Signal Frequencies from DC up to 4 GHz," In Tech. Digest (1995), pp. 384–387 and in U.S. Pat. No. 5,578,976 to Yao, which is assigned to the same assignee as the present application. One terminal from each of two SPST MEM switches are connected together to form the SPDT T/R switches 28 and 32.

The fabrication methods used to create the MEM switch contacts discussed above produce metal features which are thicker than those made with standard thin-film processing. This characteristic of MEM fabrication methods also benefits the simultaneously fabricated inductors, capacitors, resonators and antennas that comprise the other components of passive transceiver section 101. The additional thickness of the metal features built up on substrate 100 produce thicker inductor coils, which lowers their resistance and raises the inductor's Q value. While standard thin-film processing produces metal layers on the order of 1 $\mu$m thick, features produced using MEM techniques may be 10–100 $\mu$m thick or more. Similarly, increasing the thickness of the capacitor and resonator plates and antenna strips reduces their losses and improves their performance. All these components: the switches, antennas, inductors, capacitors and resonators, are built up simultaneously, using common processing steps. Thus, use of MEM technology enables the integration of transceiver circuitry to an unprecedented degree, without requiring any sacrifice in transceiver performance. In fact, use of the high Q/low-loss components described above, combined with the enhanced reliability of an all-integrated/no-discrete-component device, should provide performance superior to that of the prior art.

Figure 5A:
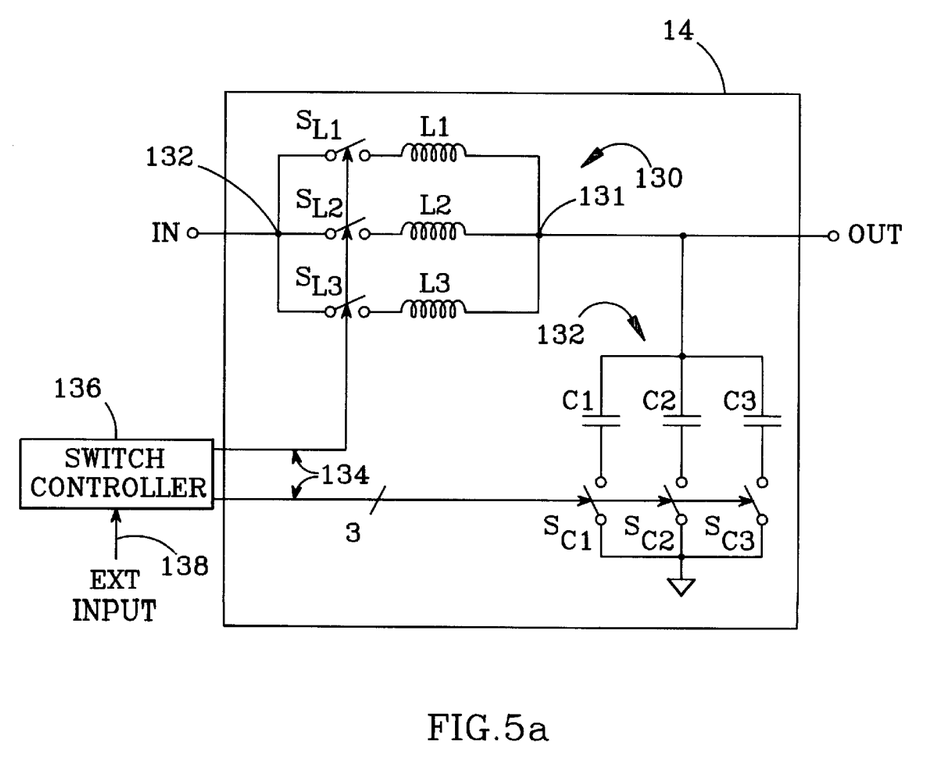
FIG. 5a is a schematic diagram of a tunable filter which may be part of an integrated passive transceiver section per the present invention.

Further improvements in transceiver performance are obtained with the use of tunable inductors and capacitors, which preferably incorporate the MEM switches described above. An example of the use of tunable components is shown in FIG. 5a. A filter 14, for example, is made up of a tunable inductor 130 and a tunable capacitor 132. The tunable inductor 130 is made from three fixed inductors L1, L2 and L3, arranged in parallel and connected together at one end to form a first tunable inductor terminal 131. The other ends of inductors L1, L2 and L3 are each connected to a first terminal of a respective MEM switch $S_{L1}$, $S_{L2}$, and $S_{L3}$, with the switches' second terminals connected together to form a second tunable inductor terminal 132. Similarly, tunable capacitor 132 is made up of three fixed capacitors C1, C2 and C3, which can be selectively connected together in parallel by properly operating respective MEM switches $S_{C1}$, $S_{C2}$, and $S_{C3}$. The MEM switches are independently controlled via control lines 134, which are typically manipulated with a switch controller 136 that receives commands, from a microprocessor, for example, via an external input 138. An inductance value is established by opening and/or closing the MEM switches $S_{L1}$, $S_{L2}$, and $S_{L3}$ as necessary, and a capacitance value similarly determined by the state of switches $S_{C1}$, $S_{C2}$, and $S_{C3}$. In this way, the characteristics of filter 14 can be tuned, either while in use, to shift the filter's frequency response, for example, or at the time of assembly. Using tunable components for this latter purpose eliminates the need to acquire a highly accurate component prior to assembly, which is a technique on which prior art transceivers commonly rely.

Tunable inductor 130 and capacitor 132 can include more or less fixed-value reactive components than the three shown, and the fixed-value components can be arranged in series, parallel, or any series-parallel combination. The number and configuration of the reactive components and switches is determined by the application's requirements, such as the inductance or capacitance range and resolution needed. Additional details on the fabrication and use of the preferred MEM tunable inductors and capacitors described above can be found in co-pending U.S. application Ser. Nos. 08/848,137 to Bartlett, et al. (tunable inductor) and 08/848, 116 to Bartlett, et al. (tunable capacitor), each assigned to the same assignee as the present application and hereby incorporated by reference.

Discrete tunable reactive components could also be used to provide an adjustment capability for the transceiver's filters comparable to that provided by the preferred integrated tunable components described above, but because such discrete components cannot be integrated, the advantages gained with the high level of integration provided by the invention would be somewhat sacrificed.

Figure 5B:
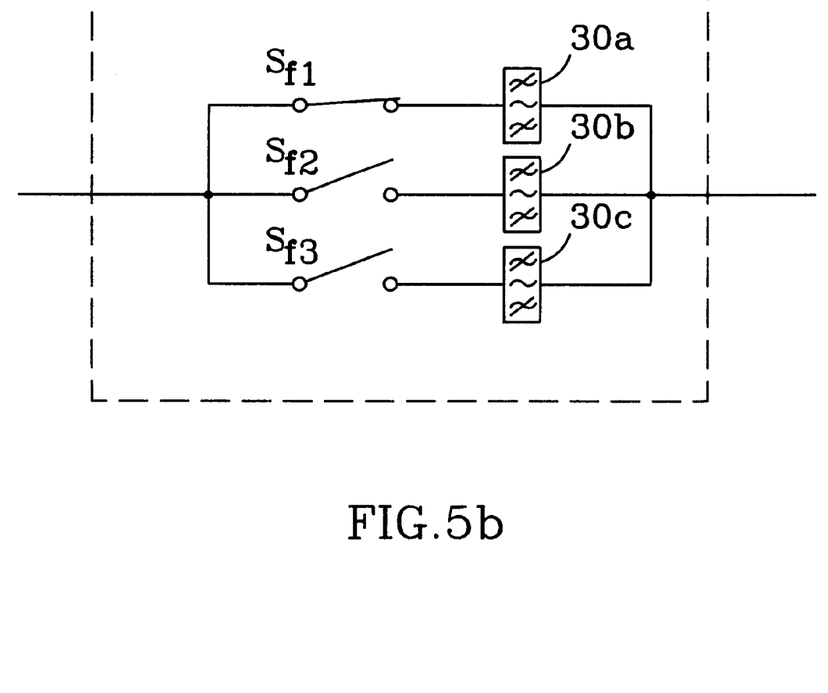
FIG. 5b is a schematic diagram illustrating the multiplexing of multiple passive circuits to provide different signal path characteristics per the present invention.
Figure 5C:
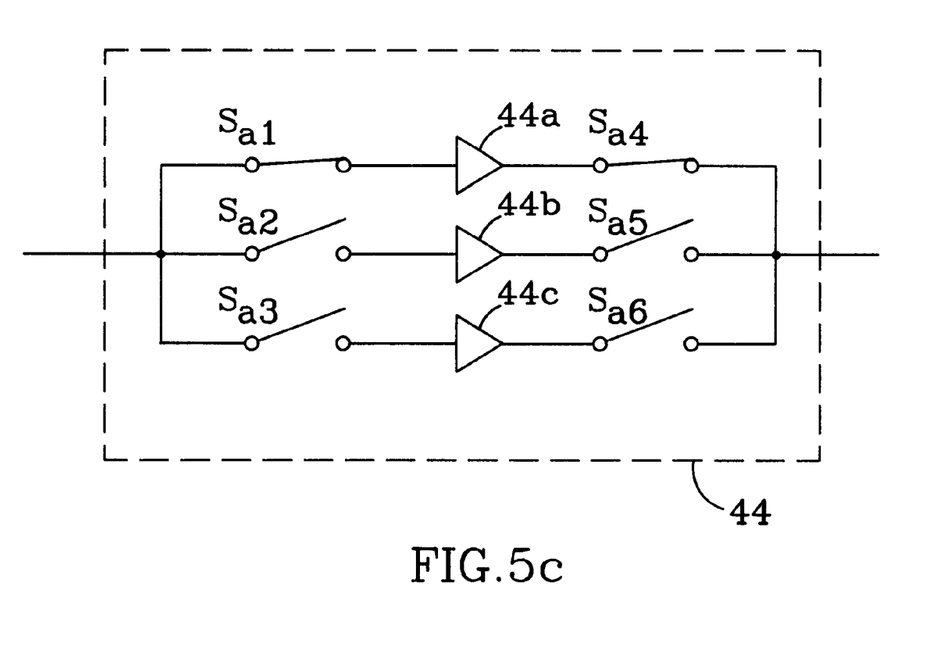
FIG. 5c is a schematic diagram illustrating the multiplexing of multiple active circuits to provide different signal path characteristics per the present invention.

The use of the MEM switching devices described above can be further extended to allow for the integration of multiple passive and active circuits in parallel paths that may be switched in and out dynamically to achieve different signal path characteristics. It may be desirable, for example, to be able to direct a signal to one of several frequency specific RF/analog circuits or filters. Examples of this are shown in FIGS. 5b and 5c. FIG. 5b expands the circuitry comprising filter 30. Each of individual filters 30a, 30b and 30c have different passband center frequencies. An incoming signal is directed to an appropriate filter with MEM switches $S_{f1}$–$S_{f3}$, and can be redirected to a different filter by simply controlling the state of the switches. Similarly, FIG. 5c expands the circuitry comprising LNA 44. Here, individual LNAs 44a, 44b and 44c are frequency selective (or otherwise different in gain, power, efficiency, linearity characteristic or frequency response). An incoming signal is directed to an appropriate LNA with MEM switches $S_{a1}$–$S_{c1}$, and MEM switches $S_{a2}$–$S_{c2}$ select which of the LNA outputs to deliver to a following stage. This approach allows signal paths with different characteristics to be switched into and out of a transceiver circuit as needed, with the other transceiver components shared by the various paths.

This use of MEM switching devices in this way may be extended to include the switching in and out of, for example, different power amplifiers, VCOs, entire synthesizers, or resonant tank or reference oscillator circuits. Such switching facilitates the integration of active circuits and antennas that operate at different frequencies for multi-mode communication systems, for example, but is equally suitable to other applications for which the ability to direct signals along several different signal paths can optimize performance. By combining this switched signal path approach with the already high level of integration afforded by the present invention, even higher levels of integration may be achieved that are also very flexible and cost efficient.

A transceiver incorporating the integrated passive transceiver section offers a major advantage over prior art designs because of the degree to which its passive components, particularly its switches, inductors, capacitors, resonators and antennas, can be integrated on a common substrate with common processing steps. One possible fabrication sequence illustrating the integration and interconnection of an antenna, T/R switch, inductor, and capacitor/resonator is shown in FIGS. 6a–6h (plan views) and 7a–7h (corresponding cross-sectional views). The fabrication sequence shown, which includes only one switch, one inductor, one capacitor/resonator and two antennas is intended to merely illustrate the process. The passive components of a transceiver per the present invention would typically include a number of antennas, switches, capacitors, inductors and resonators. The reactive components are combined in various ways to form the transceiver's filters, and the switches are used to selectively connect components to and from the antennas, and to adjust the value of the preferred tunable components as discussed above, if such components are being used.

Figure 6A:
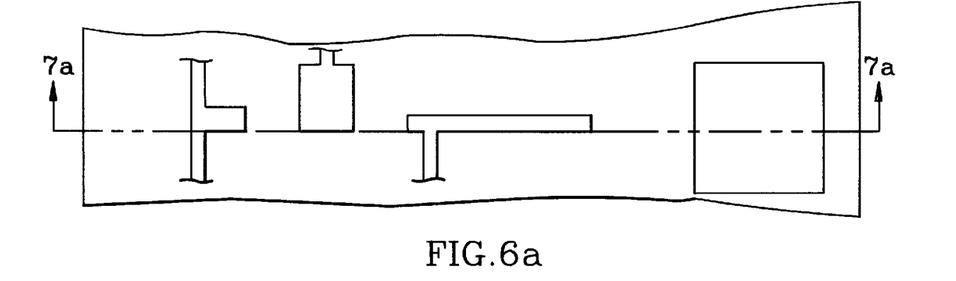
FIGS. 6a–6h are plan views showing a fabrication sequence for integrating a transceiver's passive components per the present invention.
Figure 6B:
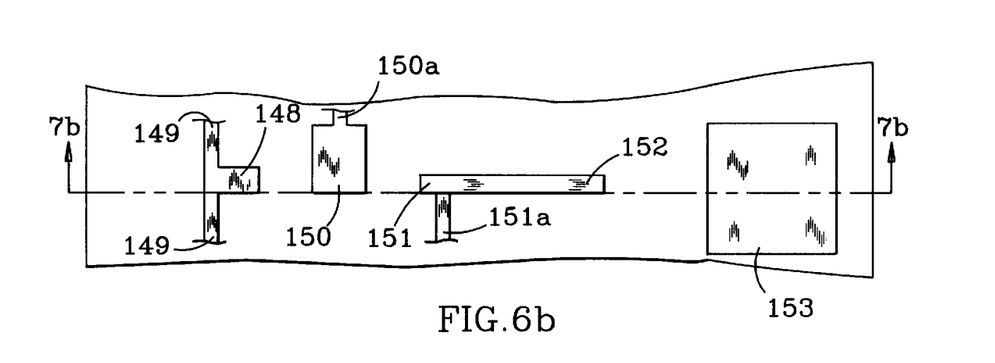
Figure 6C:
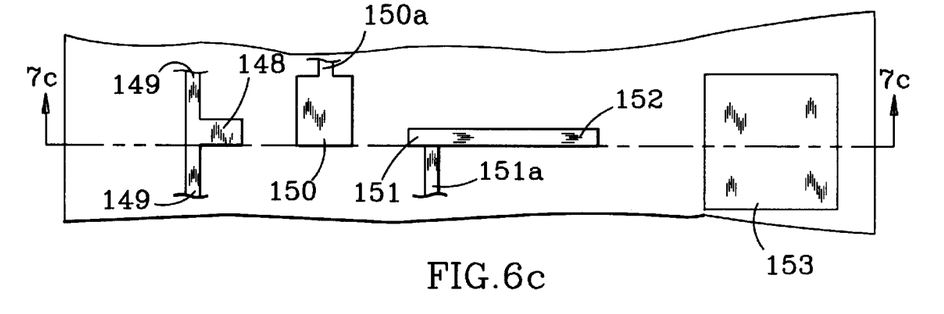
Figure 6D:
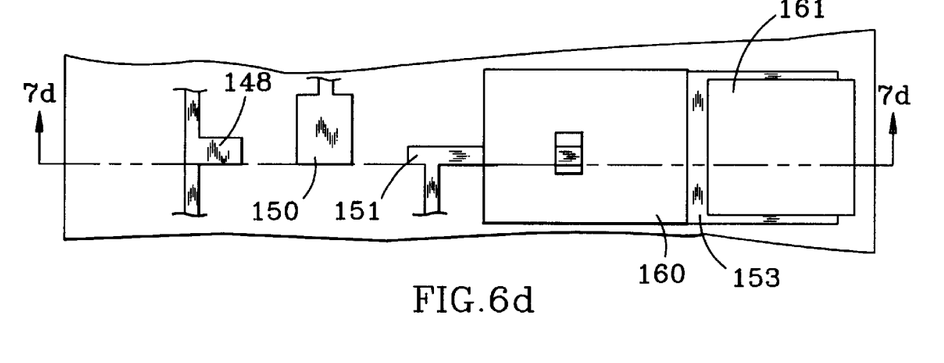
Figure 7A:
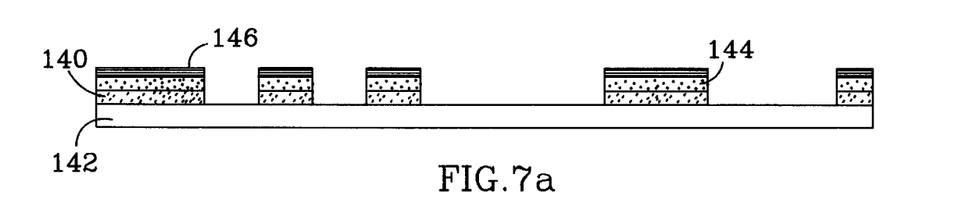
FIGS. 7a–7h are cross-sectional views which correspond with FIGS. 6a–6h, respectively, showing a fabrication sequence for integrating a transceiver's passive components per the present invention.
Figure 7B:
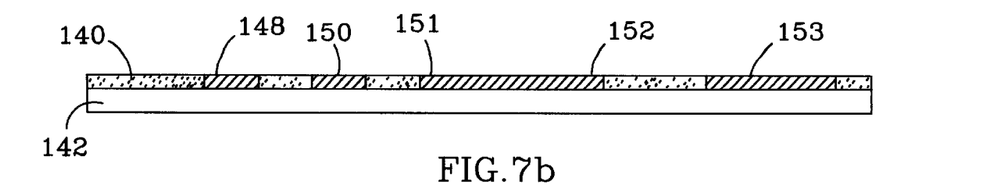
Figure 7C:
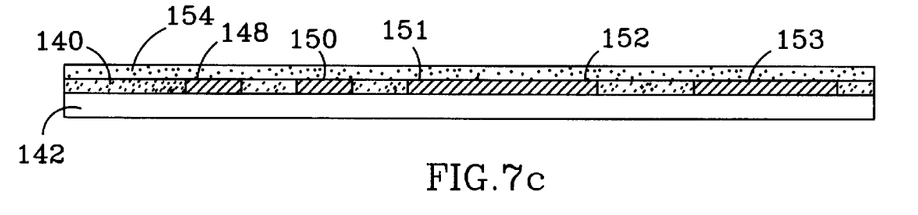
Figure 7D:
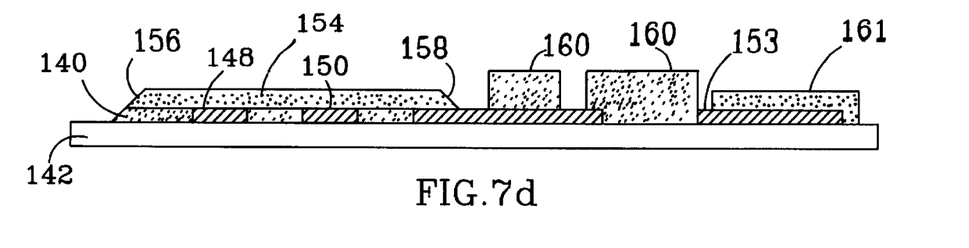

As shown in FIG. 7a (layers not shown in FIG. 6a), a first sacrificial material 140, such as a layer of thermal setting polyimide, is deposited on a substrate 142. A second sacrificial layer, such as a layer of preimidized polyimide 144 that can be selectively removed from the first sacrificial layer, is then deposited. A layer of silicon nitride 146, preferably about 1500 Å thick, is then deposited and patterned using photolithography and reactive ion etching (RIE) in $CHF_3$ and $O_2$ chemistry. The pattern is transferred to the underlying polyimide layers using $O_2$ RIE, resulting in the cross-section shown in FIG. 7a. This creates a "lift-off" profile compatible with the selective deposition of metal into the distinct open areas. In FIGS. 6b and 7b, a layer of metal is deposited, preferably by electron beam evaporation, which is about equal in thickness to the first sacrificial layer 140. The second sacrificial layer 144, the silicon nitride layer 146 and the metal on top of it are then dissolved away in a solution such a methylene chloride, retaining the metal in the original open areas along with the first sacrificial layer 140. This first metal layer defines the bottom electrode 148 of a MEM switch and the traces 149 which carry a voltage to the electrode, and two metal traces 150 and 151 which form the gapped signal line which is bridged when the switch is actuated. The end of trace 151 which is not adjacent to trace 150 forms the center tap 152 of what will become an inductor. Traces 150 and 151 also include metal interconnection runs 150a and 151a which connect to other circuitry (not shown). Also formed is the bottom plate 153 of what will become a capacitor or resonator. Next, an additional sacrificial polyimide layer 154 is deposited (FIG. 7c, not shown in FIG. 6c) and patterned to form sloping sidewalls 156 and 158 using $O_2$ RIE (FIG. 7d, not shown in FIG. 6d), and a selective deposition of a thick insulating material, preferably silicon dioxide, forms support post 160 for the inductor coils (FIGS. 6d and 7d).

A dielectric layer 161 is also formed atop bottom plate 153, which serves as the middle layer of a capacitor or a resonator. If a capacitor is being formed, the dielectric layer 161 is formed at the same time and of the same material as support post 160. If, however, bottom plate 153 is to serve as part of a resonator, an additional patterning and deposition step is performed (not shown) in which a thin film material having piezoelectric properties, such as zinc oxide, is deposited to make dielectric layer 161. Sandwiching a piezoelectric thin film material between two metal plates forms a resonator. Alternatively, surface acoustic wave (SAW) resonators can be similarly implemented using interdigitated piezoelectric material fingers.

Figure 6E:
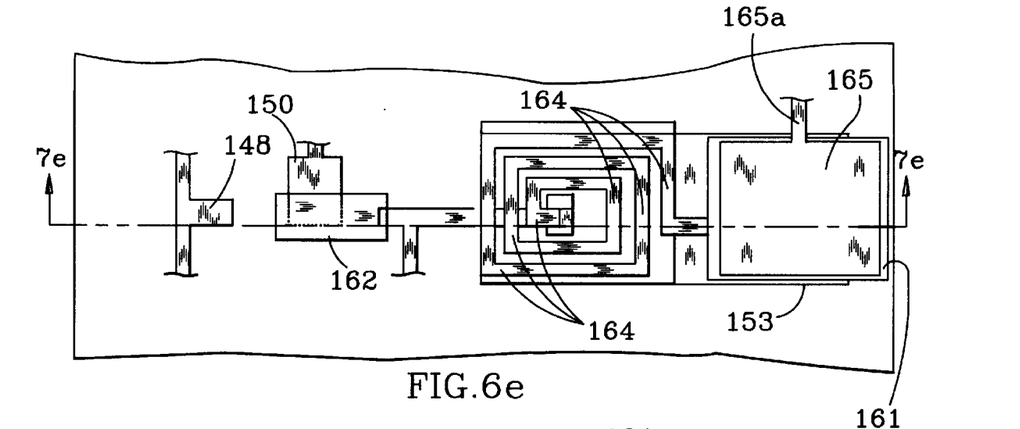
Figure 7E:
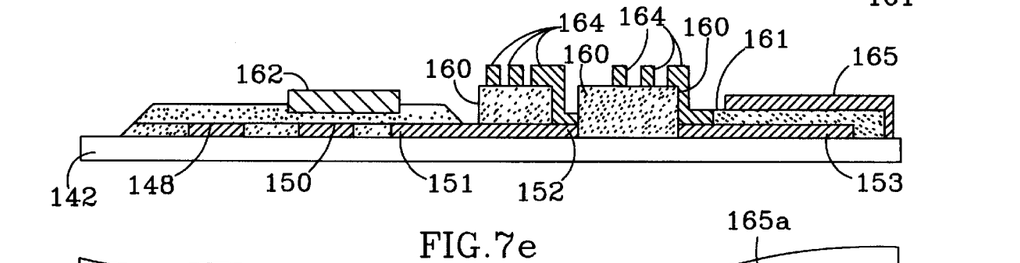

As shown in FIGS. 6e and 7e, another layer of metal is deposited and patterned to form the switch's contact electrode 162 and the inductor coils 164 (orthogonal portions of the coils not shown in FIG. 7e for clarity), with the outermost coil arranged to make contact with and terminate at bottom plate 153. For reasons discussed below, the area where the contact electrode 162 will reside is preferably treated in an $O_2$ RIE plasma to etch a small amount, preferably 2000 Å–5000 Å, into the topmost sacrificial layer 154, so that the electrode is slightly recessed into the layer.

Also formed with the metal deposition which formed the contact electrode 162 and inductor coils 164 is a top plate 165 which completes the buildup of either a capacitor or resonator, with a metal interconnection run 165a extending from the top plate for connection to other circuitry.

Figure 6F:
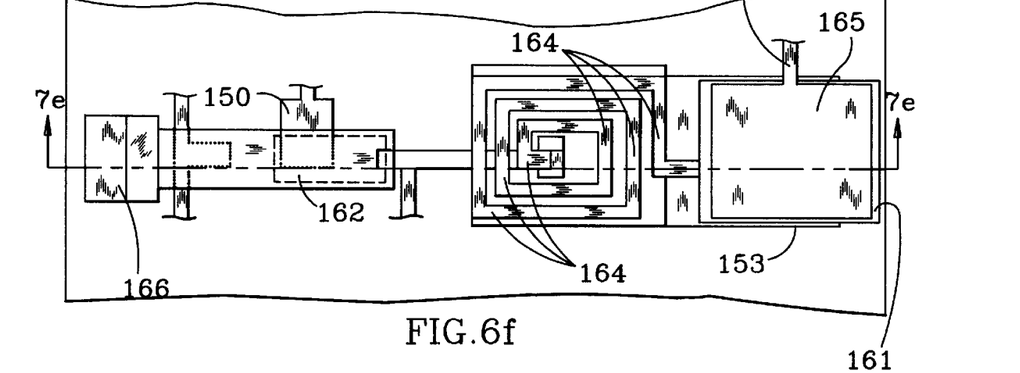
Figure 6G:
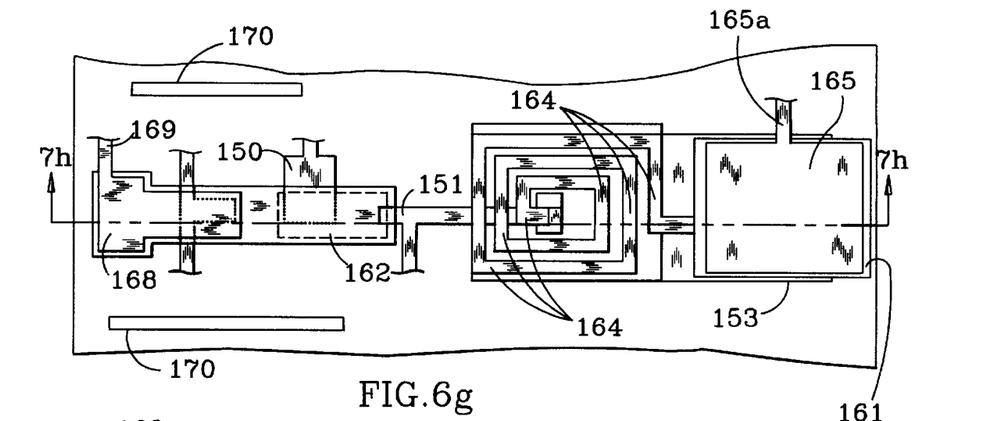
Figure 7F:
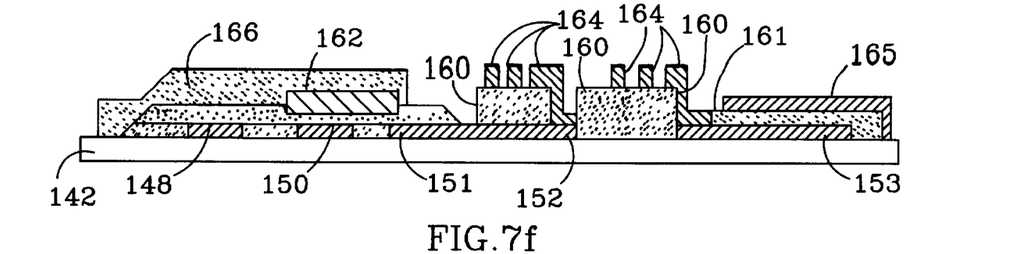
Figure 7G:
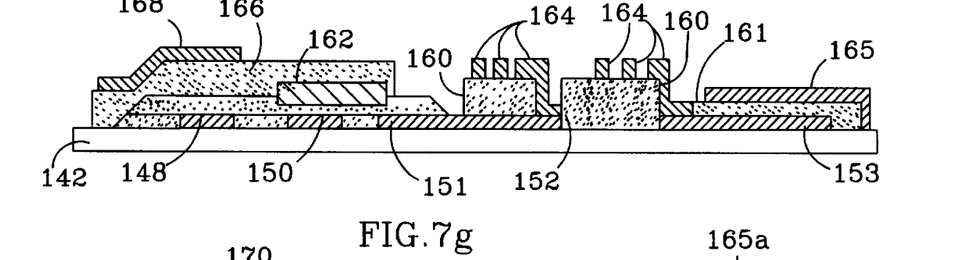

In FIGS. 6f and 7f, a cantilever arm 166 is formed from a layer, preferably about 2 $\mu$m thick, of PECVD silicon dioxide, patterned and etched with $CHF_3$ and $O_2$ RIE. In FIGS. 6g and 7g, a layer of metal, preferably aluminum about 2500 Å thick, is deposited, preferably using electron beam evaporation and lift-off, to form a top electrode 168 for the switch. The top electrode 168 preferably comes down the sidewall 156 and a metal trace 169 extends from it; a voltage is applied to the top electrode via trace 169 to actuate the switch. Also formed with this metal layer are one or more antennas 170, having widths and lengths which are defined by the particular application for which they are used.

Figure 6H:
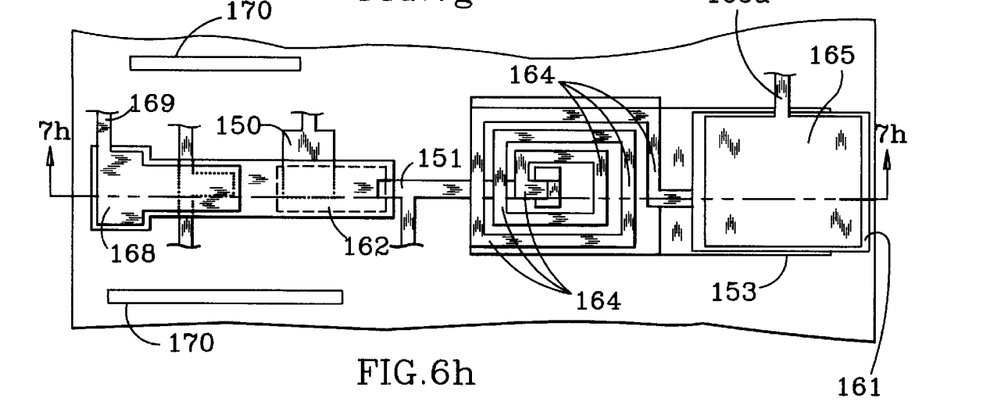
Figure 7H:
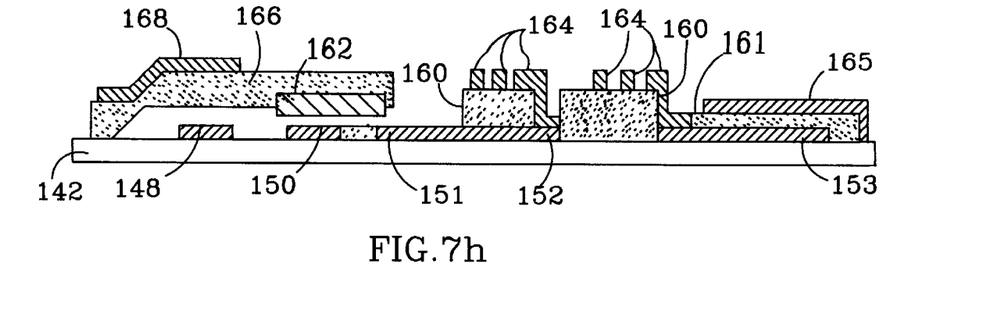

In FIGS. 6h and 7h, the sacrificial layers are removed, preferably with an unpatterned $O_2$ etch using a Branson $O_2$ barrel etcher, to remove all remaining polyimide layers on the substrate surface, including those under the cantilever arm 166. This allows the arm 166 to flex downward in response to an actuation voltage applied across the top electrode 168 via trace 169 and the bottom electrode 148 via trace 149, causing contact electrode 162 to bridge the gap between traces 150 and 152 and connecting a signal present at metal interconnection run 150a to the inductor.

As mentioned above, top electrode 162 is preferably slightly recessed into sacrificial layer 154. This is to ensure that when the switch is actuated, the contact electrode 162 bridges the traces 150, 151 before the cantilever arm comes into contact with the bottom electrode 148.

The metal which forms the inductor coils 164 and capacitor/resonator top plate 165 is preferably made as thick as possible, to reduce the inductor's resistance and to increase its Q, and to reduce the capacitor/resonator's losses. However, the switch's contact electrode 162 is formed with the same deposition step as the coils and top plate and may become too heavy if made too thick, so that a compromise is necessary between coil/top plate thickness and contact thickness. The necessity of making this compromise can be avoided if an alternative fabrication sequence is followed in which the inductors and/or capacitors/resonators are fabricated on the substrate first, without simultaneously building up the switches. When the inductor/capacitor fabrication is complete, the sequence picks up with the deposition of the polyimide layers 140 and 144 and the silicon nitride layer 146 as shown in FIG. 6a. These layers serve to protect the inductors/capacitors while the switches are built up; all the protective layers are removed when the unpatterned $O_2$ RIE etch step is performed as shown in FIGS. 6h and 7h. This method requires more processing steps to be executed, but allows for a more flexible choice of inductor and capacitor/resonator design parameters. For example, this approach permits the metal of the inductor coils to be thicker than that of the contact electrode, lowering the resistance of the coils and raising the inductor's Q. Fabrication of integrated inductors and capacitors is discussed, for example, in C. T. Wang, *Introduction to Semiconductor Technology*, John Wiley & Sons (1990), pp. 422–433.

The fabrication sequence shown in FIGS. 6a–6h and 7a–7h shows the inductor elevated above the substrate by support post 160. This arrangement is preferred because it reduces parasitic capacitance between the inductor coils and the substrate. Alternatively, the coils can be fabricated directly on an insulating substrate, with the center tap brought out over the coils via the use of air bridges.

Figure 8:
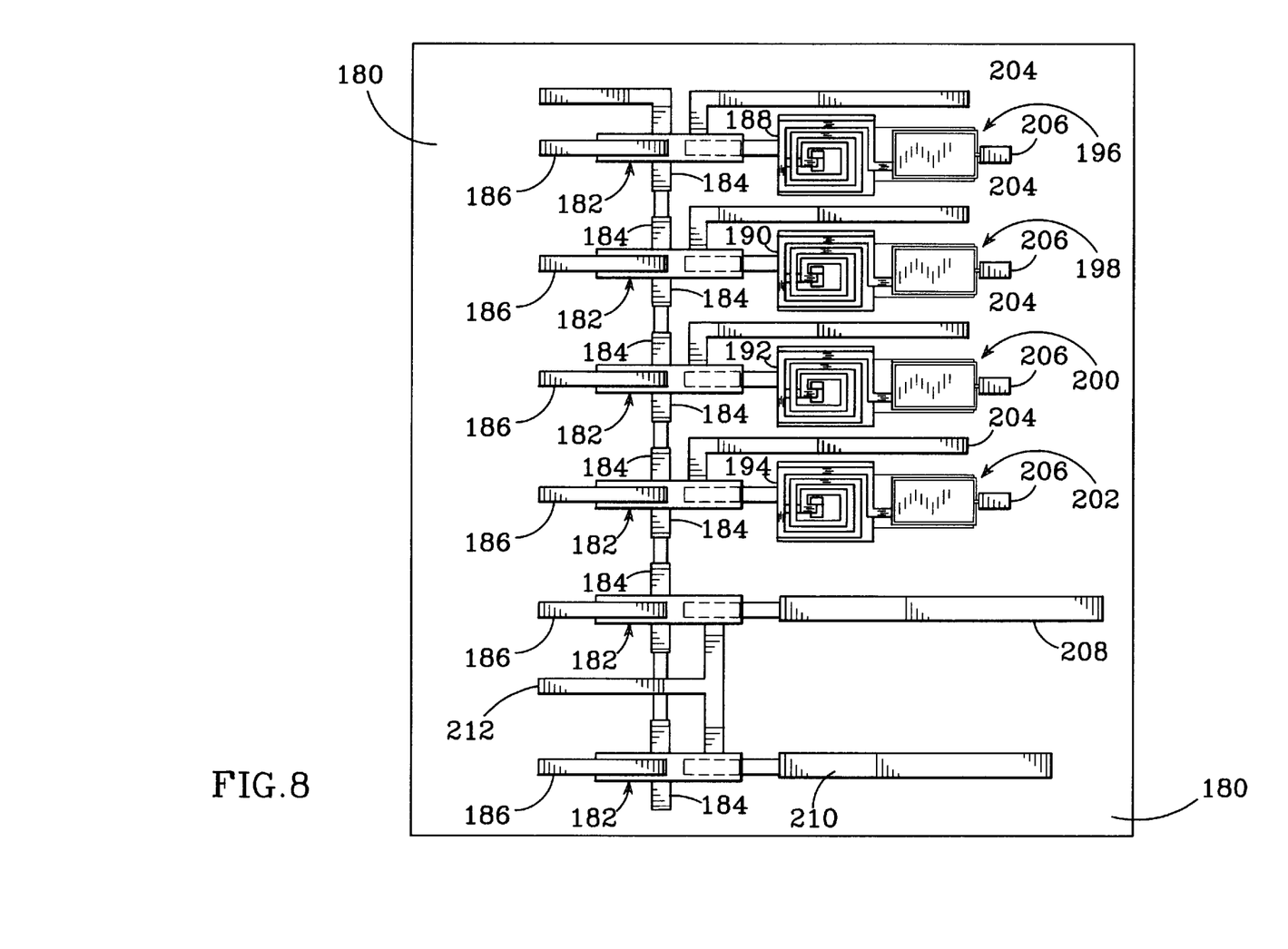
FIG. 8 is a plan view illustrating the integration of a plurality of passive components on a common substrate per the present invention.

As stated above, the device fabrication shown in FIGS. 6 and 7 is merely illustrative. Antennas, switches, inductors, capacitors, and resonators are fabricated and interconnected together on a common substrate as needed to implement the transceiver's passive components. Inductors, capacitors and/or resonators are fabricated and interconnected to form filters and/or tank circuits as needed. An illustrative example is shown in the plan view of FIG. 8, in which a plurality of passive transceiver components are integrated on a common substrate 180. Six MEM switches 182 are shown, with their respective bottom electrodes 184 interconnected together and their top electrodes 186 independently connectable to separate control signals, so that each switch can be independently opened and closed. Four inductors 188, 190, 192 and 194 are shown connected between respective switches and other respective passive components as follows: inductors 188 and 190 are connected to respective capacitors 196 and 198, and inductors 192 and 194 are connected to respective resonators 200 and 202. Metal interconnecting runs 204 and pads 206 are brought to the edge of substrate 180 for connection to another die, via wire bonds, for example. Antennas 208 and 210 are integrated on substrate 180 as well, either of which can be connected to a signal line 212 via appropriate switching of their respective MEM switches.

Fabrication of some or all of the transceiver components on a silicon substrate, as shown in FIG. 2 for the transceiver's active components on substrate 102, in FIG. 3 for the transceiver's active components on substrate 105, and in FIG. 4 for both active and passive devices on substrate 120, is performed per well-known CMOS or bipolar fabrication techniques, as are discussed, for example, in A. Grebene, *Bipolar and MOS Analoa Integrated Circuit Design*, John Wiley & Sons (1984), pp.

Fabrication of the transceiver's power amplifier on a GaAs substrate 107 as in FIG. 3, is performed per well-known GaAs fabrication techniques, as are discussed, for example, in C. Wang, *Introduction to Semiconductor Technology: GaAs and Related Compounds*, John Wiley & Sons (1990), pp. 123–133 and 187–195.

While particular embodiments of the invention have been shown and described, numerous variations and alternate embodiments will occur to those skilled in the art. Accordingly, it is intended that the invention be limited only in terms of the appended claims.

We claim:

1. An integrated passive transceiver section, comprising:
a first substrate,
at least one antenna,
at least one micro-electromechanical (MEM) transmit/receive (T/R) switch arranged to route signals to and from said at least one antenna, said MEM T/R switch comprising a top electrode positioned on the top side of a cantilever arm, a contact electrode affixed to the bottom side of said cantilever arm, a bottom electrode positioned on said substrate, and a gapped signal line positioned on said substrate below said contact electrode, said cantilever arm extending over said bottom electrode such that, when an actuation voltage is applied across said top and bottom electrodes, said cantilever arm is electrostatically drawn toward said substrate and said contact electrode bridges said gapped signal line to create a continuous signal path, and
at least one reactive component suitable for use in a transceiver circuit,
said at least one antenna, said MEM T/R switch, and said at least one reactive component integrated and interconnected on said first substrate to implement an integrated passive transceiver section suitable for combining with other components to form a transceiver.

2. The passive transceiver section of claim 1, wherein said first substrate is glass.

3. The passive transceiver section of claim 1, wherein said at least one antenna comprises a transmit antenna and a receive antenna.

4. The passive transceiver section of claim 3, wherein said at least one T/R switch comprises a single-pole double-throw switch arranged to selectably connect a signal to said transmit antenna or said receive antenna.

5. The passive transceiver section of claim 4, wherein said single-pole double-throw (SPDT) switch comprises two single-pole single-throw (SPST) switches, said SPST switches having respective first and second terminals, said first terminals connected together such that said two SPST switches function as an SPDT switch.

6. The passive transceiver section of claim 1, wherein said at least one reactive component is an integrated tunable inductor.

7. The passive transceiver section of claim 1, wherein said at least one reactive component is an integrated tunable capacitor.

8. The passive transceiver section of claim 1, wherein said passive transceiver section includes at least two reactive components, said reactive components integrated and interconnected together on said first substrate to form at least one filter suitable for use with a transceiver.

9. The passive transceiver section of claim 1, wherein said passive transceiver section includes at least two of said reactive components, said reactive components integrated and interconnected together on said first substrate to form at least one tank circuit suitable for use with a transceiver.

10. The passive transceiver section of claim 1, further comprising at least one resonator integrated on said first substrate arranged to form part of an oscillator circuit suitable for use with a transceiver.

11. The passive transceiver section of claim 1, further comprising a second substrate bearing active electrical components, said active components interconnected to said passive transceiver section to implement the RF/analog and analog/digital portions of a transceiver.

12. The passive transceiver section of claim 11, wherein said second substrate is silicon.

13. The passive transceiver section of claim 1, further comprising a second substrate separate from said first substrate, said second substrate bearing a power amplifier interconnected with said passive transceiver section and arranged to amplify signals routed to said antenna.

14. The passive transceiver section of claim 13, wherein said second substrate is gallium arsenide.

15. The passive transceiver section of claim 1, wherein said at least one reactive component and said at least one MEM T/R switch are fabricated with common processing steps such that said reactive components have metal features which are at least 10 $\mu$m thick, said metal thickness improving the performance of said reactive component over components fabricated with conventional thin-film metal features that are about 1 $\mu$m thick.

16. The passive transceiver section of claim 1, further comprising additional circuitry interconnected with said passive transceiver section to form a complete transceiver.

17. The passive transceiver section of claim 1, some of said reactive components arranged into multiple signal paths which each have different characteristics, further comprising additional MEM switches integrated on said first substrate and arranged to switchably direct a signal to one of said signal paths as needed to improve the performance of said passive transceiver section.

18. An RF/analog and analog/digital (A/D) interface portion of a transceiver, comprising:
a first substrate,
a plurality of passive components fabricated on said first substrate, said passive components comprising:
at least one antenna,
at least one micro-electromechanical (MEM) transmit/receive (T/R) switch arranged to route signals to and from said at least one antenna, said MEM T/R switch comprising a top electrode positioned on the top side of a cantilever arm, a contact electrode affixed to the bottom side of said cantilever arm, a bottom electrode positioned on said substrate, and a gapped signal line positioned on said substrate below said contact electrode, said cantilever arm extending over said bottom electrode such that, when an actuation voltage is applied across said top and bottom electrodes, said cantilever arm is electrostatically drawn toward said substrate and said contact electrode bridges said gapped signal line to create a continuous signal path, and
at least one component arranged to form a filter,
said passive components interconnected to implement a passive transceiver section,
a second substrate, and
a plurality of active components fabricated on said second substrate, said active components comprising:
at least one modulator for converting the frequency of signals routed to said at least one antenna,
at least one demodulator for converting the frequency of signals routed from said at least one antenna,
said active components interconnected to implement a portion of a transceiver,
said active components on said second substrate being interconnected with said passive transceiver section to form the RF/analog and the A/D interface portions of a transceiver.

19. The transceiver portions of claim 18, further comprising a power amplifier fabricated on a third substrate and interconnected with the components on said first and second substrates to amplify signals routed to said at least one antenna.

20. The transceiver portions of claim 19, wherein said first substrate is glass, said second substrate is silicon and said third substrate is gallium arsenide.

21. The transceiver portions of claim 18, wherein said reactive components and said at least one MEM T/R switch are fabricated with common processing steps such that said reactive components have metal features which are at least 10 $\mu$m thick, said metal thickness improving the performance of said reactive components over components fabricated with conventional thin-film metal features that are about 1 $\mu$m thick.

22. The transceiver portions of claim 18, some of said passive components arranged into multiple signal paths which each have different characteristics, further comprising additional MEM switches integrated on said first substrate and arranged to switchably direct a signal to one or more of said signal paths as necessary to improve the performance of said RF/analog and A/D interface portions of a transceiver, passive components which are not in said signal paths being shared among said paths.

23. The transceiver portions of claim 18, some of said active components arranged into multiple signal paths which each have different characteristics, further comprising additional MEM switches integrated on said first substrate and arranged to switchably direct a signal to one or more of said signal paths as necessary to improve the performance of said RF/analog and A/D interface portions of a transceiver, active components which are not in said signal paths being shared among said paths.

24. An RF/analog and analog/digital interface portion of a transceiver integrated on a common substrate, comprising:

a substrate, at least one antenna, at least one micro-electromechanical (MEM) transmit/receive (T/R) switch arranged to route signals to said antenna, said MEM T/R switch comprising a top electrode positioned on the top side of a cantilever arm, a contact electrode affixed to the bottom side of said cantilever arm, a bottom electrode positioned on said substrate, and a gapped signal line positioned on said substrate below said contact electrode, said cantilever arm extending over said bottom electrode such that, when an actuation voltage is applied across said top and bottom electrodes, said cantilever arm is electrostatically drawn toward said substrate and said contact electrode bridges said gapped signal line to create a continuous signal path, at least one modulator for converting the frequency of signals routed to said at least one antenna, at least one demodulator for converting the frequency of signals received from said at least one antenna, at least one first resonator implemented as part of an oscillator circuit, for providing an oscillator signal to said at least one modulator, at least one second resonator implemented as part of an oscillator circuit, for providing an oscillator signal to said at least one demodulator, at least one inductor and one capacitor interconnected to implement a filter arranged to filter signals routed to said antenna, and at least one amplifier arranged to amplify signals routed to said antenna, said at least one antenna, switch, modulator, demodulator, resonator, filter and amplifier integrated and interconnected on said substrate.

25. The transceiver portions of claim 24, wherein said substrate is silicon.

26. The transceiver portions of claim 24, wherein said at least one filter includes an integrated tunable inductor.

27. The transceiver portions of claim 24, wherein said at least one filter includes an integrated tunable capacitor.

* * * * *